(12) United States Patent
Shite

(10) Patent No.: US 7,575,634 B2
(45) Date of Patent: Aug. 18, 2009

(54) COATING DEVICE AND COATING FILM FORMING METHOD

(75) Inventor: Hideo Shite, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 772 days.

(21) Appl. No.: 10/538,727

(22) PCT Filed: Dec. 17, 2003

(86) PCT No.: PCT/JP03/16154

§ 371 (c)(1),
(2), (4) Date: Jun. 13, 2005

(87) PCT Pub. No.: WO2004/059709

PCT Pub. Date: Jul. 15, 2004

(65) Prior Publication Data

US 2006/0068093 A1    Mar. 30, 2006

(30) Foreign Application Priority Data

Dec. 26, 2002    (JP) .............................. 2002-376233

(51) Int. Cl.
*B05B 15/04*    (2006.01)
*B05C 11/02*    (2006.01)

(52) U.S. Cl. .................... 118/326; 118/52; 118/320; 118/62; 118/63; 118/64

(58) Field of Classification Search ................. 118/52, 118/612, 319, 320, 56, 326, DIG. 7, 58, 61–64, 118/500, 501; 427/240, 345; 134/153, 198, 134/902; 396/604, 611, 627

See application file for complete search history.

(56) References Cited

U.S. PATENT DOCUMENTS 6,527,860 B1 *   3/2003   Yoshihara et al. ............. 118/50
2001/0028920 A1  10/2001  Ito et al.

FOREIGN PATENT DOCUMENTS

| JP | 64-039023 | 2/1989 |
| JP | 06-099125 | 4/1994 |
| JP | 9-10658 | 1/1997 |
| JP | 09-017722 | 1/1997 |
| JP | 9-150101 | 6/1997 |
| JP | 2001-189266 | 7/2001 |
| JP | 2002-110517 | 4/2002 |

* cited by examiner

*Primary Examiner*—Yewebdar T Tadesse
(74) *Attorney, Agent, or Firm*—Smith, Gambrell & Russell, LLP

(57) ABSTRACT

The resist coating unit (COT) has a spin chuck (41) which holds the wafer to be supplied with a resist liquid, and a process cup (50) which accommodates the spin chuck (41) and exhaustes an atmosphere around the wafer W from a bottom thereof. The process cup (50) comprises a first cup (51) with an outer circumferential wall (61*a*), and an airflow control member (52) laid out close to the wafer W in the first cup (51) in such a manner as to surround the wafer W. The airflow control member (52) has a vertical cross section of an approximately rectangular shape defined by the upper ring portion (62*a*) having a cross section of an approximately triangular shape and protruding upward, and a lower ring portion (62*b*) having a cross section of an approximately triangular shape and protruding downward. An exhaust passage (55) for substantially exhausting the atmosphere around the wafer W is formed between the outer circumferential wall (61*a*) and the airflow control member (52).

12 Claims, 8 Drawing Sheets

COMPARATIVE EXAMPLE 1

COMPARATIVE EXAMPLE 2

EXAMPLE 1

COATING DEVICE AND COATING FILM FORMING METHOD

TECHNICAL FIELD

The present invention relates to a coating process apparatus and a coating film forming method for forming a film by applying a coating liquid to a substrate to be processed.

BACKGROUND ART

For instance, in a process of fabricating a semiconductor device, a predetermined circuit pattern is formed on a semiconductor wafer by using the photolithography technology. According to this photolithography process, a resist film is formed on a wafer, the resist film is exposed in a predetermined pattern, and then the exposed wafer is developed, whereby the circuit pattern is formed thereon.

As a method of forming a resist film on a wafer, so-called spin coating is widely used, which supplies a predetermined amount of a resist liquid is supplied to the center portion of a wafer held substantially horizontally and then rotates the wafer at a high speed so as to spread the resist liquid over the entire wafer surface.

Unexamined Japanese Patent Application KOKAI Publication No. 2001-189266, for example, discloses, as an apparatus which forms a film by such spin coating, a coating process apparatus which comprises a process cup so laid out as to surround a wafer and coercively exhausts the atmosphere around the wafer by carrying out coercive exhausting from the bottom, and an airflow control plate which is so provided as to surround the wafer in atmosphere around the wafer by carrying out coercive exhausting from the bottom, and an airflow control plate which is so provided as to surround the wafer in the process cup and controls an airflow generated around the wafer.

In this coating apparatus, however, as an atmosphere extraction port of a exhaust passage is positioned in the vicinity of an edge face of the wafer, drying of the resist liquid at the peripheral portion of the wafer is accelerated due to an airflow flowing into the exhaust passage. Accordingly, the resist liquid flowing toward the periphery of the wafer from the center thereof is likely to deposit on the periphery of the wafer, so that the resist film becomes thicker at the peripheral portion of the wafer than at the center portion.

Recently, as miniaturization of circuit patterns and high integration are advanced, a resist film to be formed becomes thinner and such a slight unevenness of the thickness of a resist film largely affects the yield and the quality of a product.

DISCLOSURE OF THE PRESENT INVENTION

The present invention has been made in consideration of the situations, and it is an object of the present invention to provide a coating process apparatus and a coating film forming method which enable a formation of a film having an excellent uniform thickness.

That is, according to the first aspect of the present invention, there is provided a coating process apparatus for forming a coating film on a substrate to be processed, comprising:

a holding mechanism which holds the substrate to be processed in an approximately horizontal posture;

a coating liquid supply mechanism which supplies a predetermined coating liquid to a top surface of the substrate to be processed held by the holding mechanism;

a rotation mechanism which rotates the substrate to be processed held by the holding mechanism; and an airflow control member laid out close to the substrate to be processed in such a manner as to surround a periphery thereof, and having a vertical cross section which gradually becomes thicker upward from an inside toward an outside.

According to the second aspect of the present invention, there is provided a coating process apparatus for forming a coating film on a substrate to be processed, comprising:

a holding mechanism which holds the substrate to be processed in an approximately horizontal posture;

a coating liquid supply mechanism supplying a predetermined coating liquid to a top surface of the substrate to be processed held by the holding mechanism;

a rotation mechanism rotating the substrate to be processed held by the holding mechanism; and a process container accommodating the holding mechanism and capable of exhausting an atmosphere around the substrate to be processed from a bottom, wherein the process container includes:

a first cup having an outer circumferential wall surrounding an outside of the substrate to be processed, and an airflow control member having a cross section of an approximately rectangular shape defined by an upper ring portion having a vertical cross section of an approximately triangular shape and protruding upward, and a lower ring portion having a cross section of an approximately triangular shape and protruding downward, and provided close to a periphery of the substrate to be processed in the first cup so as to surround an outer circumference of the substrate to be processed, and an exhaust passage substantially exhausting an atmosphere around the substrate to be processed is provided between the airflow control member and the outer circumferential wall of the first cup, and a space between an apex of the upper ring portion and an upper end of the outer circumferential wall defines an atmosphere extraction port for the exhaust passage.

In the coating process apparatus according to the second aspect, it is preferable that a base angle of an inside of the upper ring portion of the airflow control member should be larger than or equal to 24 degrees, but smaller than or equal to 34 degrees, or that a height of the upper ring portion should be greater than or equal to 10 mm, but less than or equal to 18 mm, or that a base angle of an inside of the lower ring portion included in the airflow control member should be larger than or equal to 25 degrees, but smaller than or equal to 35 degrees. It is preferable that the upper ring portion and the lower ring portion be integrated with each other.

It is preferable that the outer circumferential wall of the first cup should include a cylindrical vertical wall, and an inclined wall connected in a consecutive arrangement to an upper end of the vertical wall and inclined inwardly and upward, or that the inclined wall should be approximately in parallel with an outer inclined surface of the upper ring portion. It is preferable that a protrusion for suppressing a counterflow of an airflow flowing into the exhaust passage be provided inwardly of an upper end portion of the inclined wall constituting the outer circumferential wall of the first cup.

It is preferable that the process container should have such a structure that it further includes a second cup having an inclined wall expanding obliquely downward and outward from below the substrate to be processed, a drain passage which drains the coating liquid dispersed from the substrate downward is provided between the airflow control member and the inclined wall of the second cup, and a clearance between the airflow control member and the substrate to be processed defines a drain port of the drain passage. Further, it is preferable that the second cup further should have such a structure that it includes a cylindrical vertical wall extending downward from a lower end of the inclined wall thereof, the exhaust passage and the drain passage are merged with each other at a clearance formed between the outer circumferential wall of the first cup and the vertical wall of the second cup, and exhausting and draining are carried out through a bottom of the process container.

It is preferable that the airflow control member should be laid out in such a way that a vertex defined by mated inner edges of the upper and lower ring portions is higher than a position of the top surface of the substrate to be processed, so that the coating liquid dispersed from the substrate to be processed substantially strikes an inner inclined wall of the lower ring portion to be guided to the drain passage, or so that the airflow flowing in a vicinity of the periphery of the substrate to be processed substantially ascends along an inner inclined wall of the upper ring portion and flow into the exhaust passage via the atmosphere extraction port.

According to the third aspect of the present invention, there is provided a coating process apparatus for forming a coating film on a substrate to be processed, comprising:

a holding mechanism which holds the substrate to be processed in an approximately horizontal posture;

a coating liquid supply mechanism which supplies a predetermined amount of a coating liquid to a top surface of the substrate to be processed held by the holding mechanism;

a rotation mechanism which rotates the substrate held by the holding mechanism; and a process container which accommodates the holding mechanism and capable of exhausting an atmosphere around the substrate from a bottom, wherein the process container includes:

a first cup having an outer circumferential wall surrounding an outside of the substrate to be processed; and an airflow control member including an upper ring portion having a vertical cross section of an approximately triangular shape and protruding upward, and a lower ring portion including a first inclined portion inclined outward and downward from an inner apex of the upper ring portion by a predetermined length, a horizontal portion horizontally extending outward from a lower end of the first inclined portion, and a second inclined portion inclined outward and downward from the horizontal portion, and provided close to a periphery of the substrate to be processed in the first cup so as to surround an outer circumference of the substrate to be processed, an exhaust passage substantially exhausting an atmosphere around the substrate to be processed is provided between the airflow control member and the outer circumferential wall of the first cup, and a space between an apex of the upper ring portion and an upper end of the outer circumferential wall defines an atmosphere extraction port for the exhaust passage.

The structure of the coating process apparatus according to the third aspect can be the same as that of the coating process apparatus according to the second aspect except for the airflow control member. Moreover, the upper ring portion of the airflow control member used in the coating process apparatus according to the third aspect can take the same structure as the upper ring portion of the airflow control member used in the coating process apparatus according to the second aspect.

The present invention provides a coating film forming method that is employed by the above-described coating process apparatus. That is, according to the fourth aspect of the present invention, there is provided a coating film forming method comprising the steps of:

holding a substrate to be processed in an approximately horizontal posture;

adjusting positions of an airflow control member of an approximately ring shape and the substrate relatively to each other in such a manner that the airflow control member is arranged close to a periphery of the substrate to be processed and surrounds the periphery of the substrate to be processed, the airflow control member having a vertical cross section which gradually becomes thicker upward from an inside toward an outside; and forming a coating film on the substrate to be processed by supplying a predetermined coating liquid to a top surface of the substrate to be processed and rotating the substrate to be processed so as to spread the coating liquid over the entire substrate to be processed.

In the coating film forming method, it is preferable that the airflow control member in use should have a cross section of an approximately rectangular shape defined by an upper ring portion having a vertical cross section of an approximately triangular shape and protruding upward, and a lower ring portion having a vertical cross section of an approximately triangular shape and protruding downward, at the step of adjusting the positions of the substrate to be processed and the airflow control member, the substrate to be processed and the airflow control member should be accommodated in a process container having an outer circumferential wall which surrounds an outside of the substrate to be processed and capable of exhausting from a bottom thereof, and at the step of forming the coating film by rotating the substrate to be processed, an atmosphere over the substrate coat should be taken in the process container from between the airflow control member and the outer circumferential wall. Further, it is preferable that at the step of adjusting the positions of the substrate and airflow control member, the airflow control member should be laid out in such a way that a vertex defined by mated inner edges of the upper and lower ring portions is higher than a position of the top surface of the substrate to be processed. Accordingly, the coating liquid which is dispersed from the substrate to be processed can be guided below the process container by causing the coating liquid to strike on the inclined surface inside the lower ring portion.

According to the coating process apparatus and coating film forming method of the present invention can suppress the influence of an airflow, which is generated when the atmosphere around the substrate to be processed is exhausted, on the periphery of the substrate to be processed, so that a film having a uniform thickness distribution over the entire substrate can be formed.

BEST MODE FOR CARRYING OUT THE PRESENT INVENTION

An embodiment of the present invention will now be described in detail with reference to the accompanied drawings. In this embodiment, one taken as an example is a resist coating and developing apparatus that includes a resist coating unit which forms a resist film by applying a resist liquid to a semiconductor wafer, and caries out a series of processes from the formation of a resist film to the development thereof.

Figure 1:
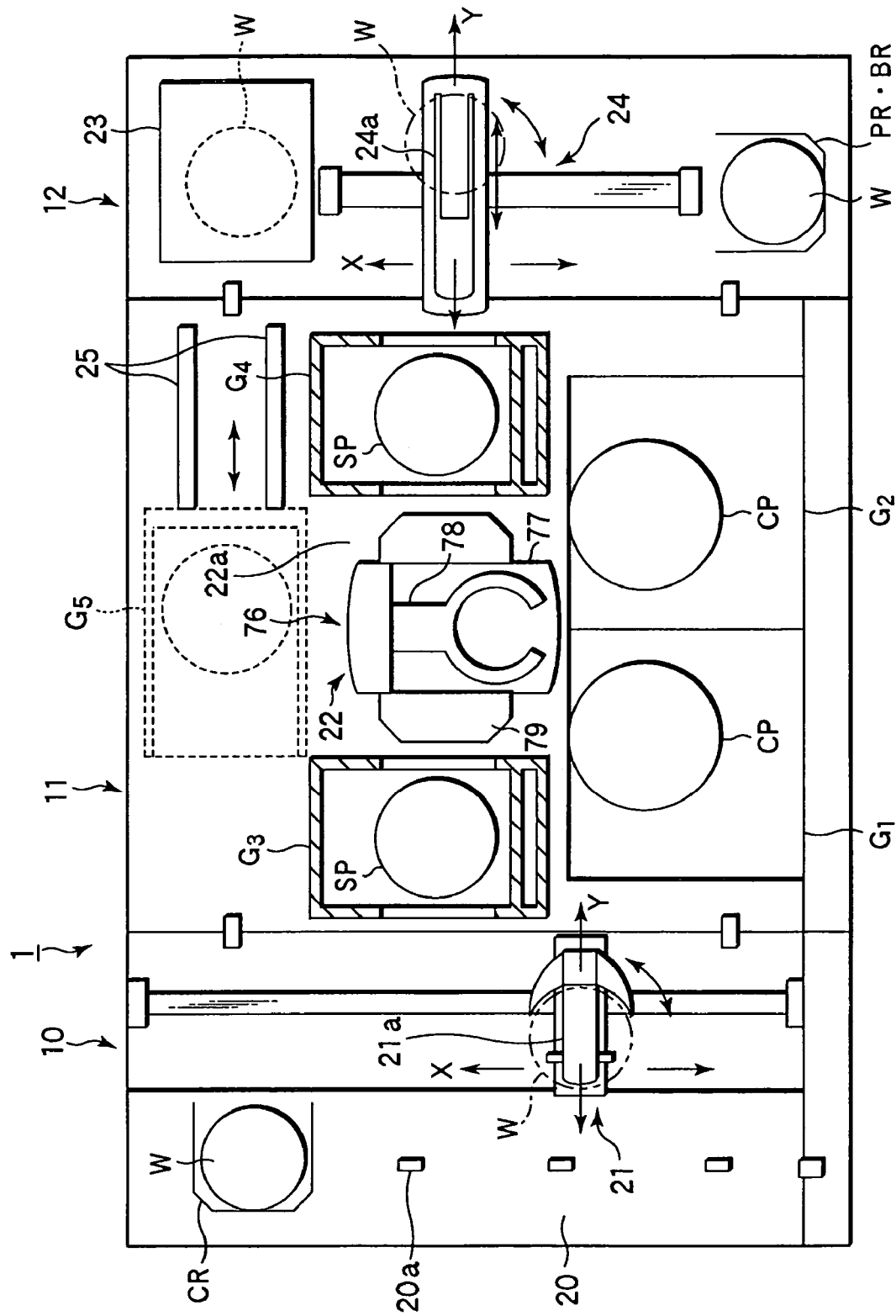
FIG. 1 is a plan view illustrating a schematic structure of a resist coating and developing system.
Figure 2:
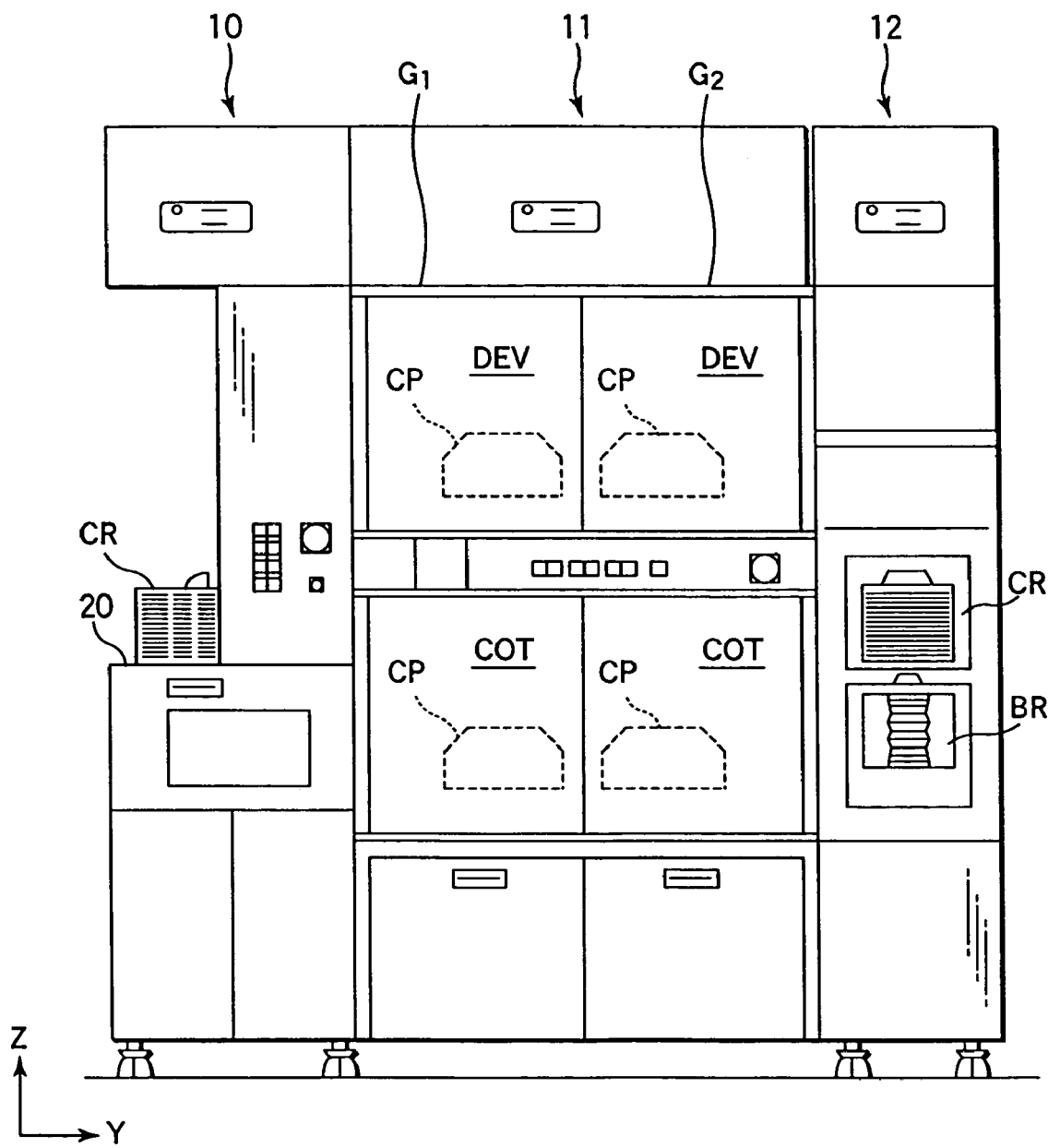
FIG. 2 is a front view illustrating the schematic structure of the resist coating and developing system.
Figure 3:
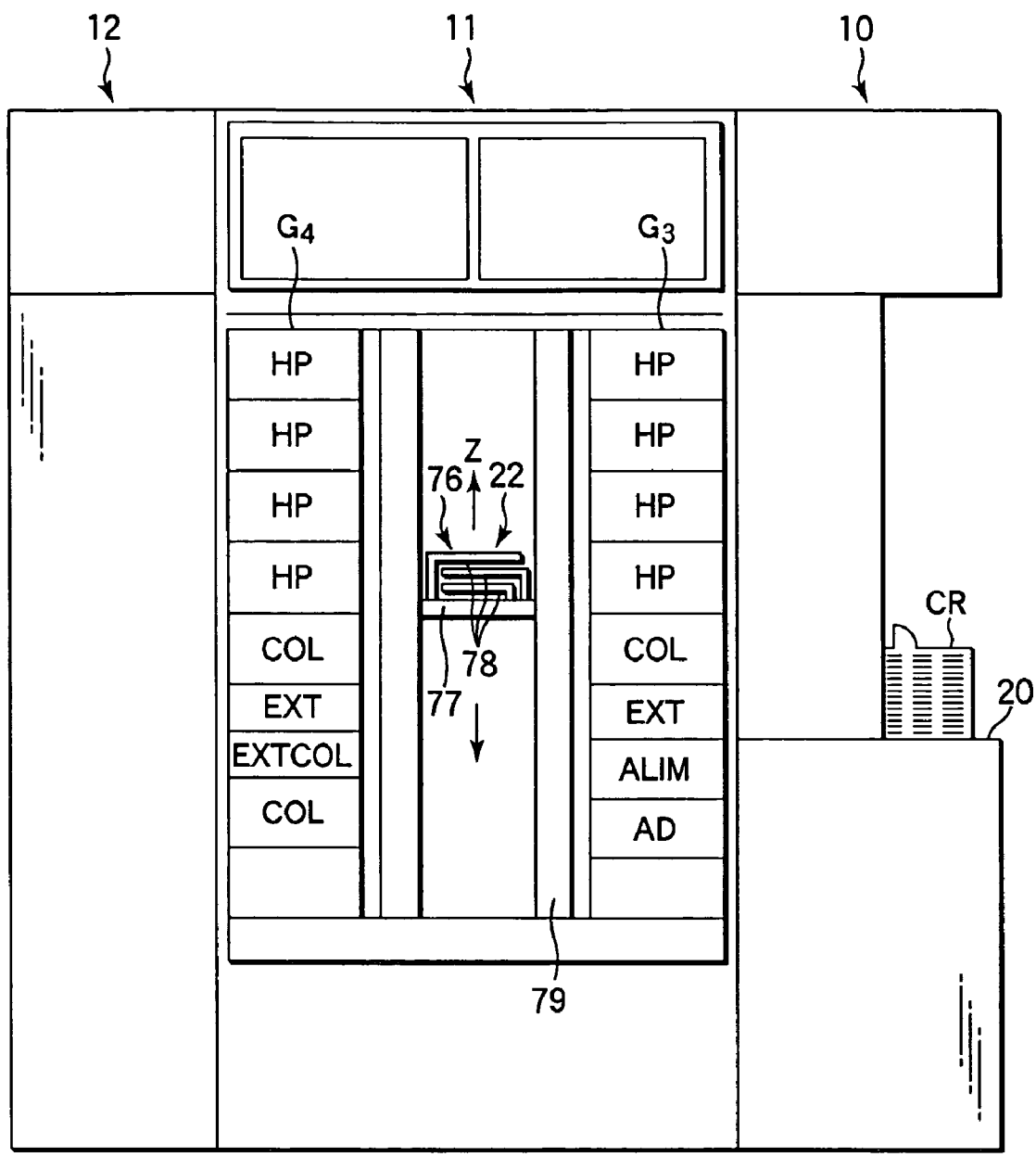
FIG. 3 is a back view illustrating the schematic structure of the resist coating and developing system.

FIG. 1 is a schematic plan view illustrating a resist coating and developing system 1, FIG. 2 is a front view thereof, and FIG. 3 is a back view thereof. The resist coating and developing system 1 comprises a cassette station 10 as a convey station, a process station 11 having a plurality of process units, and an interface station 12 for transferring a wafer W to a non-illustrated exposure apparatus provided adjacent to the process station 11.

The cassette station 10 has a cassette-placing table 20 where a wafer cassette CR capable of retaining a plurality of wafers (for instance, 25 wafers) is placed on the cassette-placing table 20. A wafer cassette CR accommodating wafers W to be processed in the resist coating and developing system 1 is conveyed to the cassette-placing table 20 of the cassette station 10 from another system. By way of contrast, a wafer cassette CR accommodating wafers W having already been processed in the resist coating and developing system 1 is carried out to another system from the cassette-placing table 20.

A plurality of positioning projections 20a (four in FIG. 1) are formed on the cassette-placing table 20 along an X direction in FIG. 1. Wafer cassettes CR are placed in a line at the locations of the positioning projections 20a, with their wafer outlet/inlet ports facing toward the process station 11. In the ware cassette CR, the wafers W are arranged in approximately horizontal postures along a vertical direction (Z direction) at predetermined intervals.

Moreover, the cassette station 10 also has a wafer conveying mechanism 21 which conveys the wafer W between the cassette-placing table 20 and the process station 11. The wafer conveying mechanism 21 is movable in the layout direction of the wafers W in the wafer cassette CR (Z direction) and the cassette layout direction (X direction), and has a wafer-conveying pick 21a which is movable back and forth in a Y direction perpendicular to the Z and X directions, and is rotatable in a horizontal plane (X-Y plane). Therefore, the wafer-conveying pick 21a can selectively access wafers W accommodated at predetermined positions in the wafer cassette CR placed on the cassette-placing table 20, and can also access an alignment unit (ALIM) and an extension unit (EXT) belonging to a third process section $G_3$ of the process station 11 to be described later.

The process station 11 has the plurality of process units for carrying out a series of processes when a resist coating and development of a resist liquid are carried out for the wafer W. The plurality of process units are arranged in multiple stages at predetermined positions. In each process unit, the wafers W are processed one by one. As illustrated in FIG. 1, the process station 11 has a wafer-conveying passage 22a at the center portion thereof, while a main wafer conveying mechanism 22 is provided at the wafer-conveying passage 22a. All of the process units are provided around the wafer-conveying passage 22a. The plural process units are separated into a plurality of process sections in each of which a plurality of process units are laid out in multiple stages along the normal direction.

As illustrated in FIG. 3, the main wafer conveying mechanism 22 is structured that it has a wafer conveying device 76 elevatable in the normal direction inside a cylindrical support 79. The cylindrical support 79 is rotatable by the rotational driving force of a non-illustrated motor, while the wafer conveying device 76 can rotate integrally with the cylindrical support 79. The wafer conveying device 76 has a plurality of holding arms 78 movable in the back and forth directions of a convey base 77, whereby the exchange of the wafer W between the respective process units is enabled by the plurality of holding arms 78.

As illustrated in FIG. 1, in the resist coating and developing system 1, four of the process sections $G_1$, $G_2$, $G_3$ and $G_4$ are actually laid out around the wafer-conveying passage 22a. The first and second process sections $G_1$ and $G_2$ among them are laid out in parallel with each other at the front side of the resist coating and developing system 1 (the front side in FIG. 1), the third process section $G_3$ is provided adjacent to the cassette station 10, while the fourth process section $G_4$ is provided adjacent to the interface station 12. A fifth process section $G_5$ can be laid out on the rear side of the resist coating and developing system 1.

As illustrated in FIG. 2, in the first process section $G_1$, two of resist coating units (COT) of a spinner type, which carries out a predetermined process on the wafer W placed on a spin chuck (not illustrated) in a coater cup (CP), and two developing units (DEV) of a spinner type, which develop a pattern of a resist, are placed one on the other in two stages in order from the bottom. Likewise, in the second process section $G_2$, two resist coating units (COT) of a spinner type and two developing units (DEV) of a spinner type are placed one on the other in two stages in order from the bottom. It is to be noted that the structure of the resist coating unit (COT) will be explained later in detail.

As illustrated in FIG. 3, in the third process section $G_3$, multiple oven type process units which carry out a predetermined process on the wafer W placed on a susceptor SP are placed one on another in multiple stages. Specifically, an adhesion unit (AD) which carries out a so-called hydrophobic process for enhancing the fixability of a resist, an alignment unit (ALIM) for performing alignment, an extension unit (EXT) which carries the wafer W in and out, a cooling plate unit (COL) for performing a cooling process; and four hot plate units (HP) which performs heat treatments on the wafer W coated with the resist liquid or the wafer W having undergone an exposure process are placed one on another another in eight stages in order from the bottom. A cooling unit (COL) may be provided in place of the alignment unit (ALIM) and may be provided with an alignment function.

In the fourth process section $G_4$, like the third process section $G_3$, oven type process units are placed placed one on another in multiple stages. That is, a cooling plate unit (COL), an extension cooling plate unit (EXTCOL) as a wafer transfer member having a cooling plate, an extension unit (EXT), a cooling plate unit (COL), and four hot plate units (HP) are placed one on another in eight stages in order from the bottom.

When the fifth process section $G_5$ is provided on the rear side of the main wafer conveying mechanism 22, it is movable sideways as seen from the main wafer conveying mechanism 22 along a guide rail 25. Accordingly, even if the fifth process section $G_5$ is provided, a room can be secured by sliding it along the guide rail 25, so that a maintenance work for the main wafer conveying mechanism 22 can be easily carried out from the rear side thereof.

As illustrated in FIGS. 1 and 2, the interface station 12 has such a structure that a portable pickup cassette PR and a fixed buffer cassette BR are laid out in two stages on its front side, a wafer edge exposure device 23 on a rear side thereof, and a wafer conveying mechanism 24 at the center portion thereof.

The wafer conveying mechanism 24 has a wafer-conveying arm 24a. The wafer-conveying arm 24a can move in the Z direction so that it can access both of the cassettes PR and BR, the wafer edge exposure device 23, the extension unit (EXT) included in the fourth process section $G_4$ of the process station 11, and a wafer transfer table (not illustrated) of the exposure apparatus adjacent to the interface station 12, respectively, while it is rotatable in the horizontal plane and is movable back and forth in the horizontal plane.

In the above resist coating and developing system 1, the wafer cassette CR accommodating the wafers W to be processed is placed on the cassette-placing table 20, the wafer-conveying pick 21a accesses the wafer cassette CR, takes one of the wafers W out therefrom, and then conveys the wafer W to the extension unit (EXT) of the third process section $G_3$.

The wafer W is carried into the process station 11 from the extension unit (EXT) by the wafer conveying device 76 of the main wafer conveying mechanism 22. Next, the wafer W is aligned by the alignment unit (ALIM) of the third process section $G_3$, conveyed to the adhesion unit (AD), and then a hydrophobic process (HMDS process) is performed in order to enhance the fixability of a resist. As the HMDS process involves heating, the wafer W after the HMDS process is conveyed to the cooling plate unit (COL) by the wafer conveying device 76, and then cooled down there.

Subsequently, the wafer W cooled down at the cooling plate unit (COL) after processed in the adhesion unit (AD), or a wafer W which has not been processed yet by the adhesion unit (AD) is conveyed to the resist coating unit (COT) by the wafer conveying device 76, coated with a resist liquid, thereby forming a resist film (film).

After this coating process, the wafer W is conveyed to the hot plate unit (HP) of the third process section $G_3$ or the fourth process section $G_4$, pre-baked, and conveyed to one of the cooling plate units (COL) to be cooled down.

Next, the wafer W is conveyed to the alignment unit (ALIM) of the third process section $G_3$, aligned, and then conveyed to the interface station 12 via the extension unit (EXT) of the fourth process section $G_4$.

In the interface station 12, a wafer edge exposure process is performed on the wafer W by the wafer edge exposure device 23, thereby removing an excessive resist. The wafer W is then conveyed to the exposure apparatus (not illustrated) provided next to the interface station 12, and an exposure process is performed on the resist film on the wafer W in a predetermined pattern.

The wafer W exposed is returned to the interface station 12, and then conveyed to the extension unit (EXT) included in the fourth process section $G_4$ by the wafer conveying mechanism 24. Next, the wafer W is conveyed to the hot plate unit (HP) of the third or fourth process section $G_3$ or $G_4$ by the wafer conveying device 76, and post-exposure baking is performed thereon. While the wafer is cooled down to a predetermined temperature in the post-exposure baking, it may be conveyed to the cooling plate unit (COL) and cooled down, as needed.

Then, the wafer W is conveyed to the developing unit (DEV) where the exposed pattern is developed. After the development, the wafer W is conveyed to the hot plate unit (HP) of the third process section $G_3$ where post baking is performed. The wafer W which has undergone such a series of processes is returned to the cassette station 10 via the extension unit (EXT) of the third process section $G_3$ and accommodated at a predetermined position in the wafer cassette CR.

Figure 4:
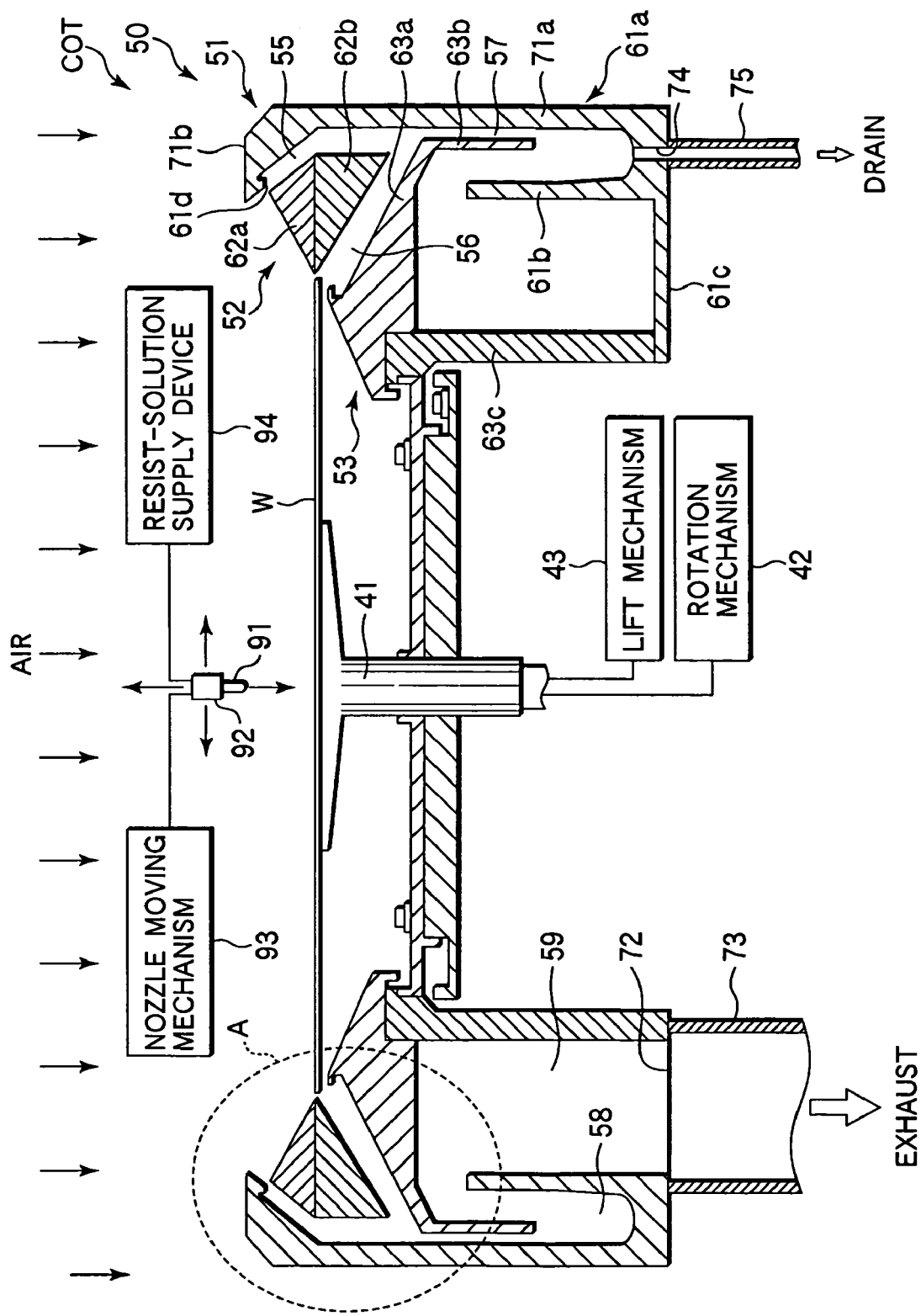
FIG. 4 is a cross sectional view illustrating the schematic structure of a resist coating unit.
Figure 5:
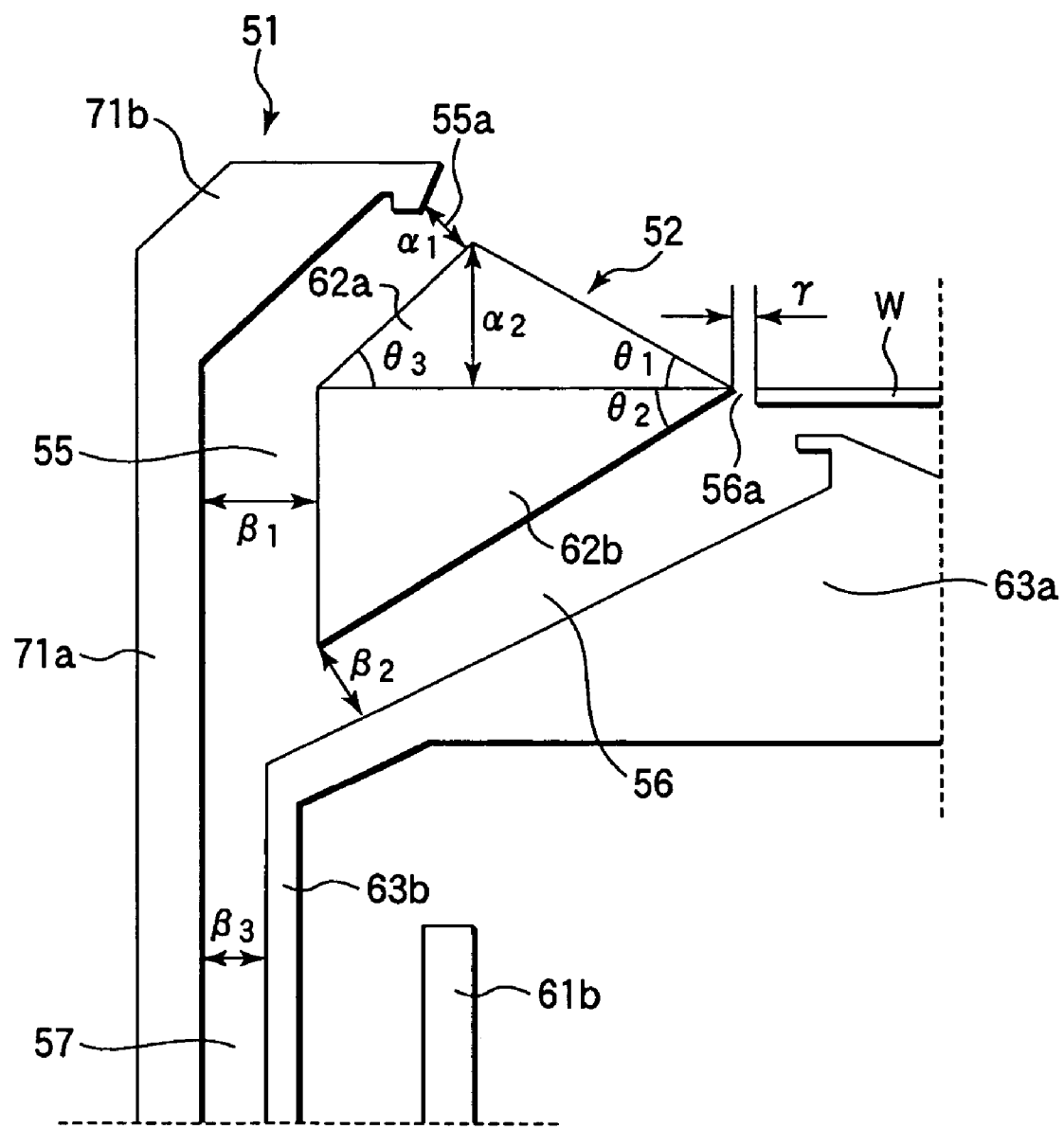
FIG. 5 is an enlarged view of an area A in FIG. 4.

Next, the resist coating unit (COT) will now be explained in detail. FIG. 4 is a schematic cross-sectional view illustrating an embodiment of the resist coating unit (COT), while FIG. 5 is an enlarged view illustrating an area A in FIG. 4. The resist coating unit (COT) comprises a spin chuck 41 holding the wafer W in an approximately horizontal posture, a rotation mechanism 42 which rotates the spin chuck 41, a lift mechanism 43 which lifts the spin chuck 41 up and down, a process cup 50 which accommodates the spin chuck 41, and a resist coating nozzle 91 which supplies a resist liquid to the top surface of the wafer W held by the spin chuck 41. A non-illustrated filter fun unit (FFU) provides a clean air from above the process cup 50 as a downflow toward the process cup 50.

The resist coating nozzle 91 is held by a nozzle holding arm 92. The nozzle holding arm 92 is movable between the center portion of the wafer W and a standby position (not shown) outside the process container by a nozzle moving mechanism 93 comprises a horizontal direction moving mechanism such as a slide mechanism or a rotation mechanism, and a lift mechanism (vertical directional moving mechanism). Moreover, the nozzle holding arm 92 can move close to or away from the top surface of the wafer W. The resist liquid is supplied to the resist coating nozzle 91 by a resist-liquid supply device 94.

The spin chuck 41 chucks and holds the wafer W in a vacuuming manner by a non-illustrated chuck mechanism. The wafer W is chucked and held by the spin chuck 41, and a predetermined amount of a resist liquid is supplied to the substantial center of the wafer W, after which the spin chuck 41 is rotated by the rotation mechanism 42, thereby forming the resist film on the wafer W. At this time, the process cup 50 collects an excessive resist liquid dispersed around the wafer W from the wafer W.

The process cup 50 generally comprises a first cup 51 so provided as to surround the outside of the wafer W, an airflow control member 52 so provided as to surround the wafer W in the first cup 51 in the vicinity of the wafer W, and a second cup 53 provided below the wafer W. The airflow control member 52 is connected to and held to the first cup 51 by link members (not illustrated) provided at plural locations on the periphery thereof.

The first cup 51 has an outer circumferential wall 61a including a cylindrical first vertical wall 71a and a first inclined wall 71b connected in a consecutive arrangement to an upper end of the first vertical wall 71a and inclined inwardly and upward, a cylindrical middle wall 61b provided inwardly of the first vertical wall 71a, and a bottom wall 61c. The airflow control member 52 has a cross section of an approximately rectangular shape defined by an upper ring portion 62a having a cross section of an approximately triangular shape and protruding upward, and a lower ring portion 62b having a cross section of an approximately triangular shape and protruding downward. The upper and lower ring portions 62a, 62b may be formed integral with each other. The second cup 53 has a second inclined wall 63a expanding outward from below the wafer W toward an obliquely downward and outward, a cylindrical second vertical wall 63b connected in a consecutive arrangement to the lower end of the second inclined wall 63a, and a cylindrical inner periphery wall 63c provided inwardly of the middle wall 61b of the first cup 51.

In the process cup 50, an exhaust passage 55 is formed between the outer circumferential wall 61a and the airflow control member 52, a drain passage 56 between the lower ring portion 62b and the second inclined wall 63a, an exhaust/drain passage 57 where the exhaust passage 55 and the drain passage 56 to be merged with each other is formed between the first vertical wall 71a and the second vertical wall 63b, a drain room 58 is formed between the outer circumferential wall 61a and the middle wall 61b, and an exhaust room 59 is formed between the middle wall 61b and the inner wall 63c. A rain port 74 is formed at that portion of the bottom wall 61c where the drain room 58 is formed, while an exhaust port 72 is formed at that portion the bottom wall 61c where the exhaust room 59 is formed. A drain tube 75 is attached to the drain port 74, while an exhaust tube 73 is attached to the exhaust port 72.

A non-illustrated exhaust apparatus is provided at the downstream of the exhaust tube 73, and the atmosphere around the wafer W is exhausted from the bottom thereof via the exhaust port 72 by the activation of the exhaust apparatus. In the resist coating unit (COT), the exhausting of the atmosphere around the wafer W is substantially carried out via the exhaust passage 55, while the draining of the resist liquid dispersed from the wafer W when rotated is substantially carried out via the drain passage 56. The exhausting and the draining will now be explained in detail.

As illustrated in FIG. 5, an exhaust port 55a in the exhaust passage 55 (hereinafter, "atmosphere extraction port") is formed between an upper end portion of the first inclined wall 71b of the first cup 51 and an apex of the upper ring portion 62a of the airflow control member 52. That is, in the resist coating unit (COT), the atmosphere extraction port 55a is provided outward and upward of the wafer W. Moreover, a resist liquid inlet 56a for allowing a resist liquid to flow into the drain passage 56 is formed between the wafer W and the airflow control member 52.

The airflow control member 52 is laid out close to the wafer W in such a way that a width γ of the resist liquid inlet 56a is narrower than a width $a_1$ of the atmosphere extraction port 55a. Accordingly, the atmosphere around the wafer W is likely to flow into the exhaust passage 55 via the atmosphere extraction port 55a, but it is difficult to flow into the drain passage 56 via the resist liquid drain port 56a. Thus way, the exhausting of the atmosphere around the wafer W is substantially carried out by the exhaust passage 55.

When the atmosphere (gas) flows into the exhaust passage 55, an intensive exhausted airflow is created in the vicinity of the atmosphere extraction port 55a. However, as the atmosphere extraction port 55a is formed at a portion apart from the wafer W, the influence of the exhausted airflow flowing to the exhaust passage 55 on the periphery of the wafer W becomes smaller. As the airflow is not easy to flow into the resist liquid drain port 56a, an intensive exhausted airflow is not to be generated in the vicinity of the resist liquid drain port 56a. In a resist film forming process with the resist coating unit (COT) used, drying of the periphery of the resist film with the exhausted airflow can be suppressed, so that the resist film having an excellent uniformity of film thickness distribution can be obtained.

The airflow control member 52 should preferably be provided in such a way that the height position of the vertex defined by mated inner corners of the upper and lower ring portions 62a and 62b is higher by, for instance, about 0.1 mm to 1 mm than the height position of the surface of the wafer W held by the spin chuck 41, so that the resist liquid dispersed from the wafer W with the spin chuck 41 rotated substantially hits the inner inclined wall of the lower ring portion 62b and guided to the drain passage 56, or the airflow flowing near the periphery of the wafer W substantially ascends along the inner inclined wall of the upper ring portion 62a and then flows into the exhaust passage 55 via the atmosphere extraction port 55a. Accordingly, the effect of making the thickness distribution more uniform can be ensured more notably.

The airflow control member 52 is laid out so that its apex (the apex of the upper ring portion 62a) is positioned lower than the top end of the first cup 51 (the highest portion of the first inclined wall 71b) so that the airflow from the wafer W is easier to flow into the atmosphere extraction port 55a.

It is preferable that an inner base angle $\theta_1$ of the upper ring portion 62a constituting the airflow control member 52 be larger than or equal to 24 degrees, but smaller than or equal to 34 degrees. When the base angle $\theta_1$ of the upper ring portion 62a is smaller than 24 degrees, the position of the atmosphere extraction port 55a drops and comes close to the wafer W, increasing the influence of the airflow, flowed to the exhaust passage 55, on the wafer W. In contrast, when the base angle $\theta_1$ of the upper ring portion 62a becomes larger than 34 degree, the airflow directed from the center of the wafer W toward the periphery thereof hits the inner inclined wall of the upper ring portion 62a and is likely to return to the center portion. This makes it easier to cause contamination of the resist film due to the adhesion of a mist of the resist liquid contained in the airflow.

An outer base angle $\theta_3$ of the upper ring portion 62a is determined according to the inclined angle of the first inclined wall 71b so as to ensure a predetermined width of the exhaust passage 55. For instance, it can be set in a range of larger than or equal to 22 degrees, and smaller than or equal to 32 degrees. As the inside and outside diameters of the airflow control member 52 vary depending on the diameter of the wafer W to be processed, the height of the upper ring portion 62a is set to a suitable value in accordance with the size of the wafer W as needed. For instance, when the diameter of the wafer W is 300 mm, the height $\alpha_2$ of the upper ring portion 62a can be set greater than or equal to 10 mm, and less than or equal to 18 mm (for instance, 14 mm).

It is preferable that an inner base angle $\theta_2$ of the lower ring portion 62b constituting the airflow control member 52 be larger than or equal to 25 degree, and smaller than or equal to 35 degrees. When the base angle $\theta_2$ of the lower ring portion 62b is larger than 35 degrees, the resist liquid dispersed from the wafer W hits the inner inclined wall of the lower ring portion 62b and bounces, whereby the periphery of the wafer W is likely to be contaminated. In contrast, when the base angle $\theta_2$ is smaller than 25 degrees, the resist liquid dispersed and an airflow generated by the scattering of the resist liquid may reach the exhaust passage 55, so that the airflow at the exhaust passage 55 is disturbed, resulting in possible counterflow of the exhausted airflow.

A width $\beta_3$ of the exhaust/drain passage 57 should preferably be narrower than a width $\beta_1$ of that portion of the exhaust passage 55 which is formed between the first vertical wall 71a and the lower ring portion 62b. Further, the width $\beta_3$ of the exhaust/drain passage 57 should preferably be narrower than a width $\beta_2$ of the drain passage 56. This is to prevent the disturbance of the airflow, which is likely to occur as the suction force at the exhaust/drain passage 57 is weakened, if the width β₃ of the exhaust/drain passage 57 is widened.

In a case where the exhausted airflow flows back in the exhaust passage 55 and exhausting above the wafer W via the atmosphere extraction port 55a is returned, the mist of the resist liquid contained in the exhausted airflow adheres to the surface of the wafer W, whereby contamination of the top surface of the resist film occurs. It is therefore preferable that the counterflow of the airflow flowed into the exhaust passage 55 be suppressed by providing a protrusion 61d protruding toward the atmosphere extraction port 55a on the upper end portion of the first inclined wall 71b of the first cup 51.

The processing of the wafer W into the resist coating unit (COT) with the above-described structure is carried out by steps to be discussed below. First, the holding arms 78 holding the wafer W is moved over the spin chuck 41, then the spin chuck 41 is lifted up, causing the wafer W to be held by the spin chuck 41. After the holding arms 78 is moved to its standby position, the spin chuck 41 is lifted down to hold the wafer W at the process height.

The resist coating nozzle 91 is moved to the center of the wafer W and a predetermined amount of the resist liquid is supplied to the top surface of the wafer W, and then the spin chuck 41 is rotated. Accordingly, the resist liquid is centrifugally spread to the periphery of the wafer W, and the downflow to the wafer W and the airflow generated around the wafer W accelerate drying of the resist film.

Most of the excessive resist liquid, dispersed from the periphery of the wafer W when the spin chuck 41 is rotated, enters the drain passage 56 via the resist liquid drain port 56a, hits the inner inclined wall of the lower ring portion 62b of the airflow control member 52, reaches the drain room 58 via the drain passage 56 and the exhaust/drain passage 57, and is then drained out through the drain port 74 and the drain tube 75. The atmosphere around the wafer W flows into the exhaust passage 55 via the atmosphere extraction port 55a, passes through the exhaust/drain passage 57, drain room 58, exhaust room 59 in order, and is then exhausted out via the exhaust port 72 and the exhaust tube 73.

A part of the resist liquid dispersed from the wafer W may adhere to the inner inclined wall of the upper ring portion 62a of the airflow control member 52, but the resist liquid adhered to the airflow control member 52 can be removed when the process cup 50 is cleaned. Moreover, in order to allow the resist liquid to spread over the top surface of the wafer W easily, it is preferable to carry out pre-processing, such as applying a solvent like a thinner to the top surface of the wafer W prior to the coating of the resist liquid on the wafer W.

Figure 7:
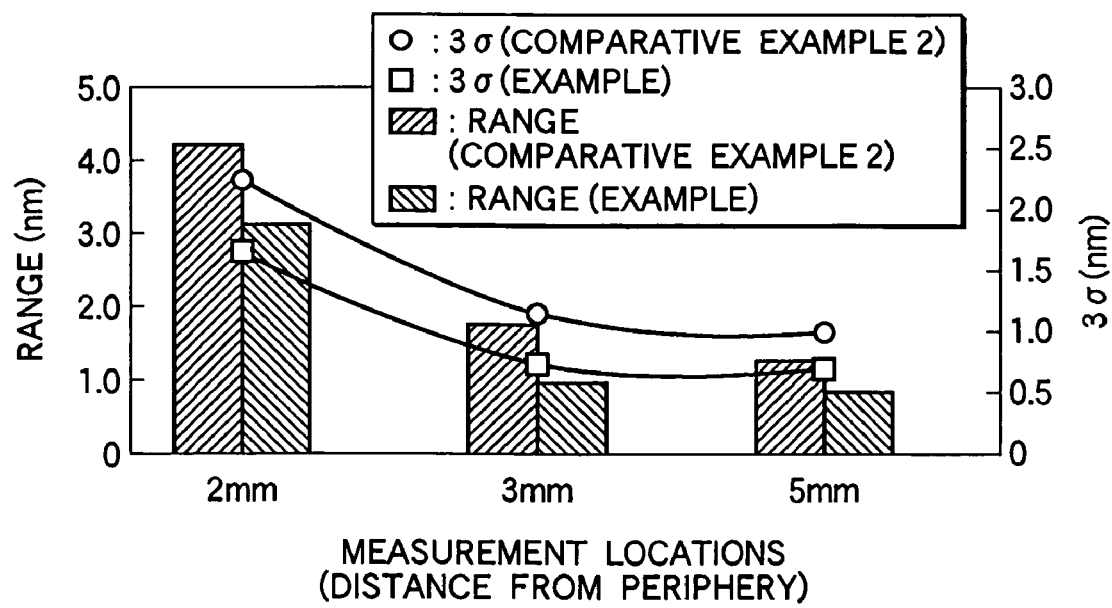
FIG. 7 is a graph illustrating ranges and value of 3 s of resist films formed by using the process cups of the Comparative Example 1 and the Example.
Figure 8:
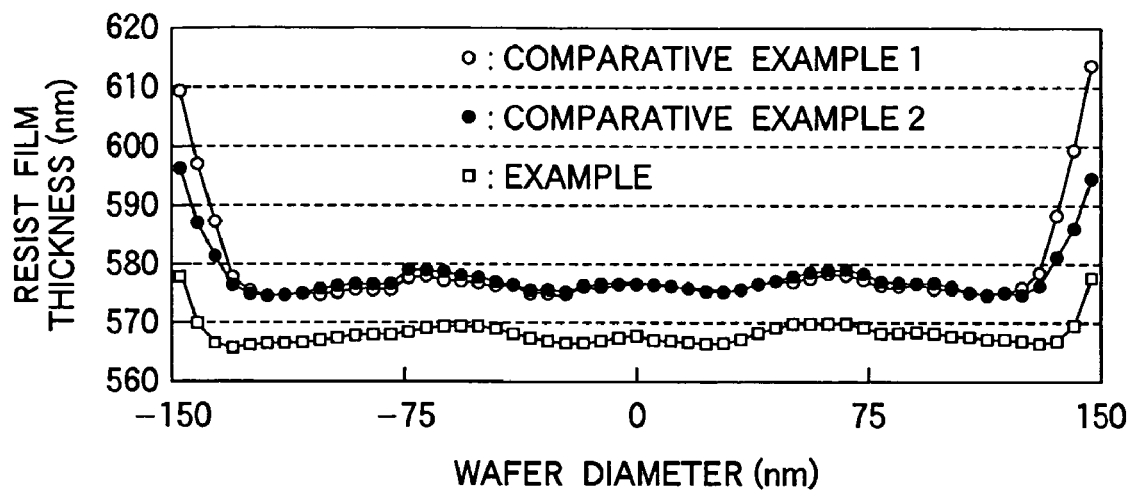
FIG. 8 is a graph representing changes in thicknesses of resist films in the radial directions of wafers, the resist films being formed by using the process cups of the Comparative Example 1, Comparative Example 2 and the Example.

When the spin chuck 41 stops rotating, it is lifted up to a predetermined height, while the holding arms 78 is moved under the spin chuck 41. Next, the spin chuck 41 is lifted down, during which the wafer W is transferred to the holding arms 78 from the spin chuck 41. The holding arms 78 carries the holding wafer W held to one of the hot plate units (HP), where pre-baking is performed on the wafer W Table 1 and FIGS. 7 and 8 show results, such as film thickness distributions, when the resist films were formed on the wafers W of 300 mm ⌀ using various process cups shown in FIGS. 6A to 6C while changing the rotation speed of the spin chuck 41.

Figure 6A:
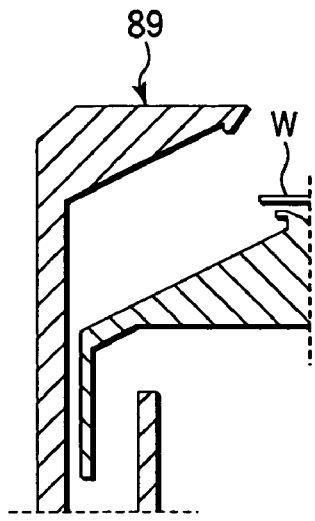
FIG. 6A is an explanatory diagram illustrating the schematic structure of a process cup of Comparative Example 1.
Figure 6B:
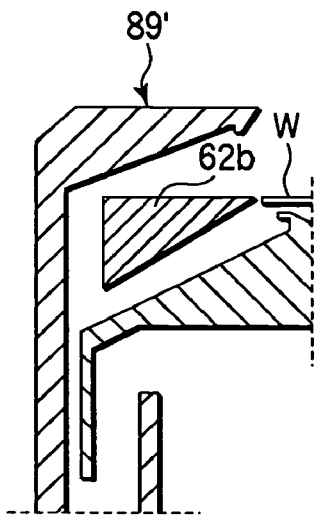
FIG. 6B is an explanatory diagram illustrating the schematic structure of a process cup of Comparative Example 2.
Figure 6C:
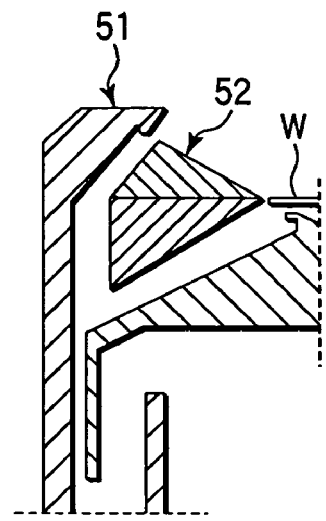
FIG. 6C is an explanatory diagram illustrating the schematic structure of a process cup of an Example.

Like FIG. 5, FIGS. 6A to 6C illustrate a portion outside and near the wafer W, and the structures of the other portions are the same. The process cup of Comparative Example 1 illustrated in FIG. 6A roughly has a modified structure of the process cup 50 from which the airflow control member 52 is removed and in which the leading end of the first inclined wall 71b of the first cup 51 is set close to the periphery of the wafer W. In FIG. 6A, the first cup constituting the process cup of the Comparative Example 1 is denoted by reference number "89". The process cup of Comparative Example 2 illustrated in FIG. 2 roughly has a modified structure of the process cup 50 from which the upper ring portion 62a of the airflow control member 52 is removed with the lower ring portion 62b remaining, and in which the leading end of the first inclined wall 71b of the first cup 51 illustrated in FIG. 4 is set close to the periphery of the wafer W (hereinafter, this is called as "first cup 89'"). The process cup of an Example shown in FIG. 6C is the same as the process cup 50 shown in FIGS. 4 and 5.

TABLE 1

| Rotation Speed | Apparatus | Range (nm) | 3σ (nm) |
| --- | --- | --- | --- |
| 800 rpm | Comparative Example 1 | 24.93 | 14.86 |
| | Comparative Example 2 | 12.80 | 7.54 |
| | Example | 4.00 | 3.56 |
| 1000 rpm | Comparative Example 1 | 12.10 | 7.02 |
| | Comparative Example 2 | 5.93 | 3.20 |
| | Example | 2.27 | 1.88 |
| 1200 rpm | Comparative Example 1 | 7.40 | 4.08 |
| | Comparative Example 2 | 3.73 | 2.08 |
| | Example | 1.67 | 1.27 |
| 1500 rpm | Comparative Example 1 | 4.07 | 2.13 |
| | Comparative Example 2 | 1.71 | 1.09 |
| | Example | 0.97 | 0.70 |
| 1800 rpm | Comparative Example 1 | 2.53 | 1.39 |
| | Comparative Example 2 | 1.40 | 0.79 |
| | Example | 1.13 | 0.70 |

With points over a circumference 3 mm inside the outer peripheries of the wafers W taken as outermost circumference measurement points, the thickness of the resist films formed on the wafers W were measured at plural locations on the diameter in this circumference. Table 1 represents values of ranges of the measuring results and 3σ. The "range" represents a difference between a maximum value measured and a minimum value measured. As the maximum value of the film thickness is a value at the outermost circumference (that is, at the circumference 3 mm inside the periphery of the wafer W), a small value of the range indicates small beaking of the resist film at the periphery. Further, "3σ" represents a standard deviation of the thickness distribution, and a small value thereof indicates that the resist film has a good uniformity of thickness.

As shown in Table 1, the values of the ranges and 3σ of Comparative Example 2 are smaller than those of the Comparative Example 1, and the values of the Example are further smaller. This seems to have occurred because in Comparative Examples 1 and 2, as the atmosphere extraction port was positioned close to the end face of the wafer W compared to the Example, the resist film at the periphery of the wafer W was likely to be dried due to the influence of the exhausted airflow, thereby making the resist film thicker. It would appear that regarding Comparative Example 1, the resist film became thicker at the periphery of the wafer W compared to Comparative Example 2 as the airflow flowing vertically hit the periphery of the wafer W so as to dry the resist film.

FIG. 7 is a graph representing the values of the ranges and 3σ at points of 2 mm, 3 mm, and 5 mm in the inside of the periphery of the wafer W for Comparative Example 2 and the Example. As is apparent from FIG. 7, the beaking of the resist film at the periphery of the wafer W is suppressed for the Example.

FIG. 8 shows changes in the thicknesses of the resist films in the radial direction of the wafers W with the number of rotations of the spin chuck 41 of 8000 rpm. As is apparent from FIG. 8, the beaking of the resist film at the periphery of the wafer W is suppressed for the Example. Moreover, it is obvious from FIGS. 7 and 8 that a resist film having a uniform thickness can be formed on the wafer W by using the process cup 50 of the Example. As shown in FIG. 8, in the Example, the overall film thickness is 10 nm thinner than those of Comparative Examples 1 and 2, but can be narrowed down to a predetermined thickness by adjusting the number of rotations and a turnover time.

Figure 9:
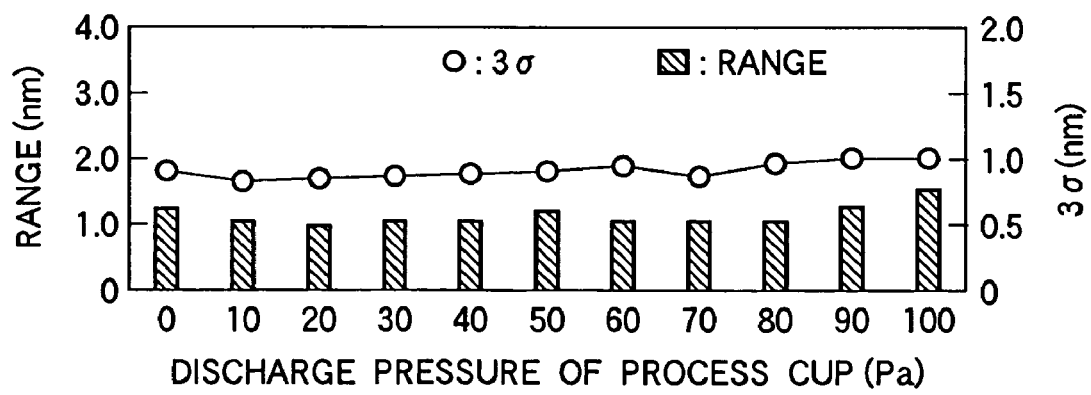
FIG. 9 is a graph representing a change in the thickness of the resist film, formed by using the process cup of the Example, in the radial direction of the wafer, with a exhaust pressure changed.

FIG. 9 represents results (the range and 3σ) of measuring the resist film thickness measured at plural locations within the circumference 3 mm inside the periphery of the wafer W on the diameter, with a constant number of rotations of the spin chuck 41 and with points over the circumference taken as outermost circumference measurement points, while changing the exhaust pressure at the exhaust port 72. It was confirmed that when the exhaust pressure at the exhaust port 72 was changed, the pressures at the exhaust passage 55 and the drain passage 56 were also changed, but the influence of such a change in pressure hardly occurs on the thickness of the resist film as illustrated in FIG. 9. This means that the atmosphere around the wafer W can be exhausted with the thickness of the resist film held constant.

Although the preferred embodiment of the present invention has been explained in detail, but the present invention is not limited to such an embodiment.

Figure 10:
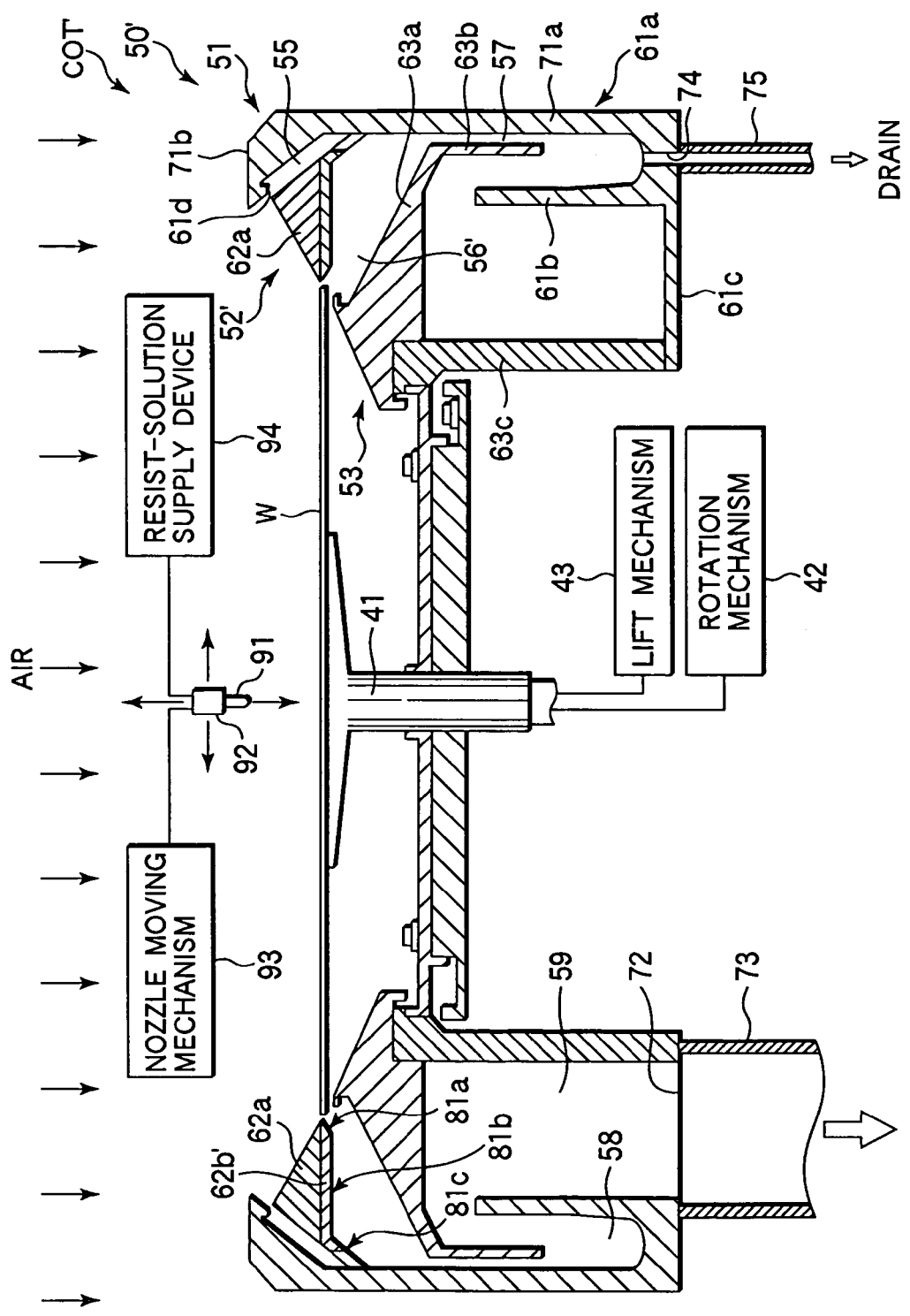
FIG. 10 is a cross sectional view illustrating the schematic structure of another resist coating unit.

For instance, the shape of the airflow control member 52 is not limited to the one illustrated in FIGS. 4 and 5. FIG. 10 is a schematic cross-sectional view illustrating a resist coating unit (COT)' having a process cup 50' with an airflow control member 52'. This resist coating unit (COT)' and the previously described resist coating unit (COT) employ the same structure except that the shapes of their airflow control members of the process cups differ from each other. The airflow control member 52' of the process cup 50' comprises the upper ring portion 62a having a vertical cross section of an approximately triangular shape and protruding upward, and a lower ring portion 62b' which has a first inclined portion 81a outward and downward inclined from an inner apex of the upper ring portion 62a by a predetermined length, a horizontal portion 81b horizontally extending from the lower end of the first inclined portion 81a toward the outside thereof, and a second inclined portion 81c outward and downward inclined from the outer end of the horizontal portion 81b. The upper and lower ring portions 62a and 62b' should preferably be integrated with each other.

The upper ring portion 62a is common to the process cup 50 and the process cup 50'. The first inclined portion 81a of the lower ring portion 62b' serves to guide the resist liquid dispersed from the wafer W downward. In the process cup 50', the width of a drain passage 56' formed between the second cup 53 and the lower ring portion 62b' is wider compared to the process cup 50. As explained above, in consideration of the fact that the width $\beta_3$ of the exhaust/drain passage 57 should preferably be narrower than the width $\beta_2$ of the drain passage 56, the wider width does not adversely affect the drain/exhaust property. Accordingly, the uniformity of the thickness of the resist film formed on the wafer W can be also enhanced by using the resist coating unit (COT)' equipped with the process cup 50' having the airflow control member 52'.

In the resist coating unit (COT) or the like, for example, as the holding arms 78 is elevatable, the position where the wafer W is held may be fixed without lifting the spin chuck 41 up and down, and the process cup 50 may be lifted up and down in such a way as not to interfere with the transfer of the wafer W when the wafer W is transferred between the spin chuck 41 and the holding arms 78.

The substrate is not limited to the semiconductor wafer, and may be a glass substrate for FPD (Flat Panes Display). Further, the coating liquid is not limited to the resist liquid, and may be, for instance, a chemical solution to be used in forming an interlayer insulation film by spin coating.

INDUSTRIAL APPLICABILITY

As described above, the coating process apparatus of the present invention is suitable for forming a coating film, such as a resist film, on a substrate such as a semiconductor wafer.

The invention claimed is:

1. A coating process apparatus for forming a coating film on a substrate to be processed, comprising:
   a holding mechanism which holds the substrate to be processed in an approximately horizontal posture;
   a coating liquid supply mechanism supplying a predetermined coating liquid to a top surface of the substrate to be processed held by the holding mechanism;
   a rotation mechanism rotating the substrate to be processed held by the holding mechanism; and
   a process container accommodating the holding mechanism and capable of exhausting an atmosphere around the substrate to be processed from a bottom, wherein
   the process container includes:
   a first cup having an outer circumferential wall surrounding an outside of the substrate to be processed, and
   an airflow control member having a cross section of an approximately rectangular shape defined by an upper ring portion having a vertical cross section of an approximately triangular shape and protruding upward, and a lower ring portion having a cross section of an approximately triangular shape and protruding downward, and provided close to a periphery of the substrate to be processed in the first cup so as to surround an outer circumference of the substrate to be processed, wherein
   an exhaust passage substantially exhausting an atmosphere around the substrate to be processed is provided between the airflow control member and the outer circumferential wall of the first cup, and wherein
   a space between an apex of the upper ring portion and an upper end of the outer circumferential wall defines an atmosphere extraction port for the exhaust passage.

2. The coating process apparatus according to claim 1, wherein a base angle of an inside of the upper ring portion of the airflow control member is larger than or equal to 24 degrees, but smaller than or equal to 34 degrees.

3. The coating process apparatus according to claim 1, wherein a height of the upper ring portion is greater than or equal to 10 mm, but less than or equal to 18 mm.

4. The coating process apparatus according to claim 1, wherein a base angle of an inside of the lower ring portion included in the airflow control member is larger than or equal to 25 degrees, but smaller than or equal to 35 degrees.

5. The coating process apparatus according to claim 1, wherein the upper ring portion and the lower ring portion are integrated with each other.

6. The coating process apparatus according to claim 1, wherein the outer circumferential wall of the first cup includes a cylindrical vertical wall, and an inclined wall connected in a consecutive arrangement to an upper end of the vertical wall and inclined inwardly and upward.

7. The coating process apparatus according to claim 6, wherein the inclined wall is approximately in parallel with an outer inclined surface of the upper ring portion.

8. The coating process apparatus according to claim 7, wherein a protrusion for suppressing a counterflow of an airflow flowing into the exhaust passage is provided inwardly of an upper end portion of the inclined wall constituting the outer circumferential wall of the first cup.

9. The coating process apparatus according to claim 1, wherein the process container further includes a second cup having an inclined wall expanding obliquely downward and outward from below the substrate to be processed,
   a drain passage which drains the coating liquid dispersed from the substrate downward is provided between the airflow control member and the inclined wall of the second cup, and a clearance between the airflow control member and the substrate to be processed defines a drain port of the drain passage.

10. The coating process apparatus according to claim 9, wherein the second cup further includes a cylindrical vertical wall extending downward from a lower end of the inclined wall thereof, and
   the exhaust passage and the drain passage are merged with each other at a clearance formed between the outer circumferential wall of the first cup and the vertical wall of the second cup, and exhausting and draining are carried out through a bottom of the process container.

11. The coating process apparatus according to claim 9, wherein the airflow control member is laid out in such a way that a vertex defined by mated inner edges of the upper and lower ring portions is higher than a position of the top surface of the substrate to be processed, so that the coating liquid dispersed from the substrate to be processed substantially strikes an inner inclined wall of the lower ring portion to be guided to the drain passage.

12. The coating process apparatus according to claim 9, wherein the airflow control member is provided in such a way that a vertex defined by mated inner edges of the upper and lower ring portions is higher than a position of the top surface of the substrate to be processed, so that the airflow flowing in a vicinity of the periphery of the substrate to be processed substantially ascends along an inner inclined wall of the upper ring portion and flow into the exhaust passage via the atmosphere extraction port.

* * * * *